United States Patent
Niimi et al.

(10) Patent No.: US 6,377,513 B2
(45) Date of Patent: Apr. 23, 2002

(54) METHOD FOR WRITING DATA TO SEMICONDUCTOR MEMORY AND SEMICONDUCTOR MEMORY

(75) Inventors: Masahiro Niimi, Kasugai (JP); Yasuharu Sato, San Jose, CA (US); Tadao Aikawa; Hitoshi Ikeda, both of Kawasaki (JP); Hiroyuki Kobayashi, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/763,627

(22) Filed: Mar. 6, 2001

Related U.S. Application Data (63) Continuation of application No. PCT/JP99/05227, filed on Sep. 24, 1999.

(30) Foreign Application Priority Data

Sep. 25, 1998 (JP) ............................................. 10-271970

(51) Int. Cl.[7] .................................................. G11C 8/00
(52) U.S. Cl. ...................................................... 365/233
(58) Field of Search .......................... 365/233, 230.03, 365/194, 205, 207

(56) References Cited

U.S. PATENT DOCUMENTS

| 5,812,485 A | 9/1998 | Yuh |
| 5,959,936 A | 9/1999 | Seo et al. |

FOREIGN PATENT DOCUMENTS

| EP | 0778575 | 6/1997 |
| EP | 0829880 | 3/1998 |
| GB | 2308702 | 7/1997 |
| JP | A-9-320277 | 12/1997 |
| JP | A-10-162576 | 6/1998 |
| JP | A-11-339465 | 12/1999 |

*Primary Examiner*—Vu A. Le
(74) *Attorney, Agent, or Firm*—Arent Fox Kintner Plotkin & Kahn, PLLC (57) ABSTRACT

A semiconductor memory device that performs a flash write operation without increasing the circuit area. Column selection lines CL0–CL7 extend parallel to word lines at locations corresponding to where column gates are formed. During a flash write mode, the subcolumn decoder 14 simultaneously selects the column selection lines. This writes cell information to every memory cell connected to the selected word line.

7 Claims, 7 Drawing Sheets

METHOD FOR WRITING DATA TO SEMICONDUCTOR MEMORY AND SEMICONDUCTOR MEMORY

CROSS-REFERENCE TO RELATED APPLICATION

This application is a continuation of PCT application number PCT/JP99/05227 filed on Sep. 24, 1999.

BACKGROUND OF THE INVENTION

The present invention relates to a semiconductor memory provided with a flash write function.

An image DRAM is provided with a block write function that enables rewriting of information stored in a plurality of memory cells, which are connected to the same word line, at once. However, unlike a VRAM (video RAM), the image DRAM is not provided with a block write function, which rewrites the cell information of every memory cell connected to the same word line at once. In recent years, there is a demand for image DRAMs, which are used in digital cameras, digital video cameras, and the like, to be provided with the flash write function so that the image DRAM can adapt to multiple functions.

Figure 7:
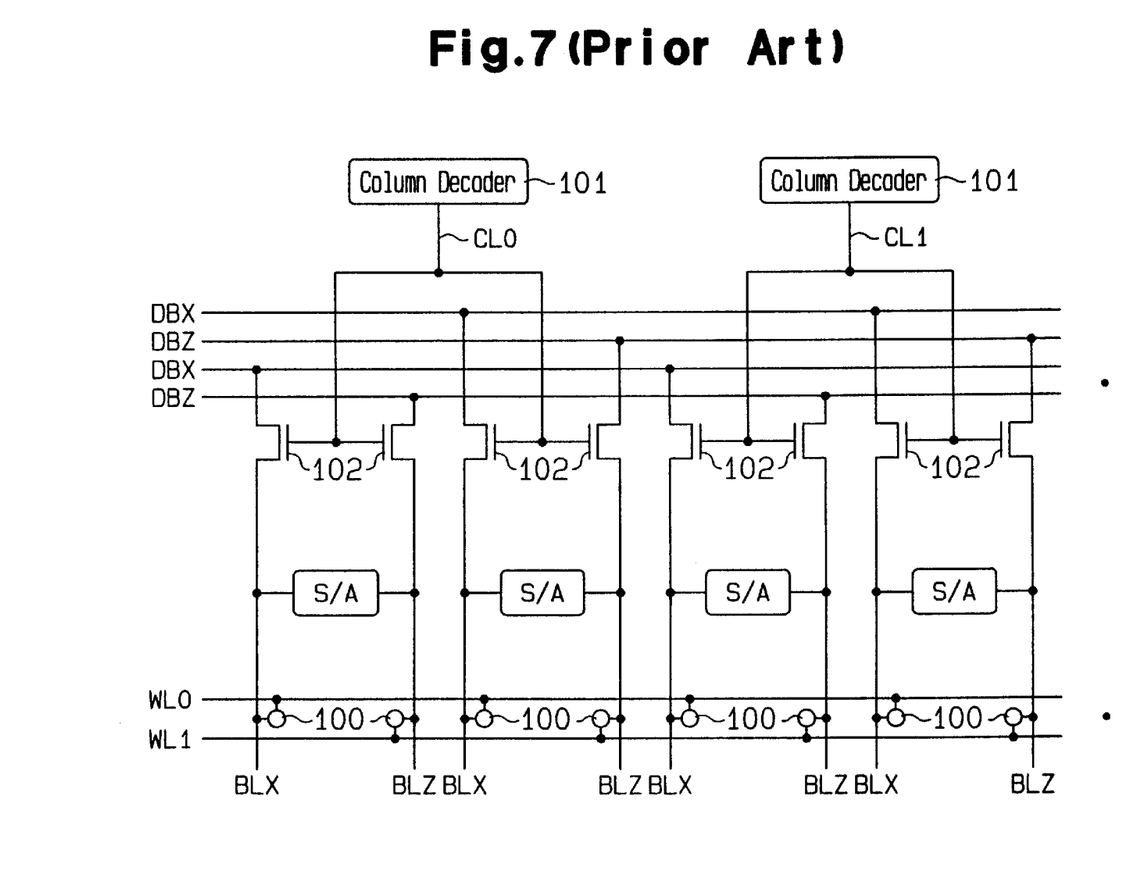
FIG. 7 is a schematic diagram of a cell array structure of a prior art image DRAM.

FIG. 7 is a schematic diagram illustrating a cell array structure of a conventional image DRAM. During a block write operation of the image DRAM, the cell information of memory cells 100 selected by column selection lines CL0, CL1, which are connected to selected word lines WL0, WL1 and column decoders 101, is rewritten at once.

During the block write operation, the loads applied to the column decoders 101 increase in comparison to a normal write operation and delays the leading edges of the signals in each of the selected column selection lines CL0, CL1. This is because the column decoders 101 must select a large number of the column selections lines CL0, CL1 and drive many column gate transistors 102. Thus, the block write time is longer than the normal write time.

Figure 6:
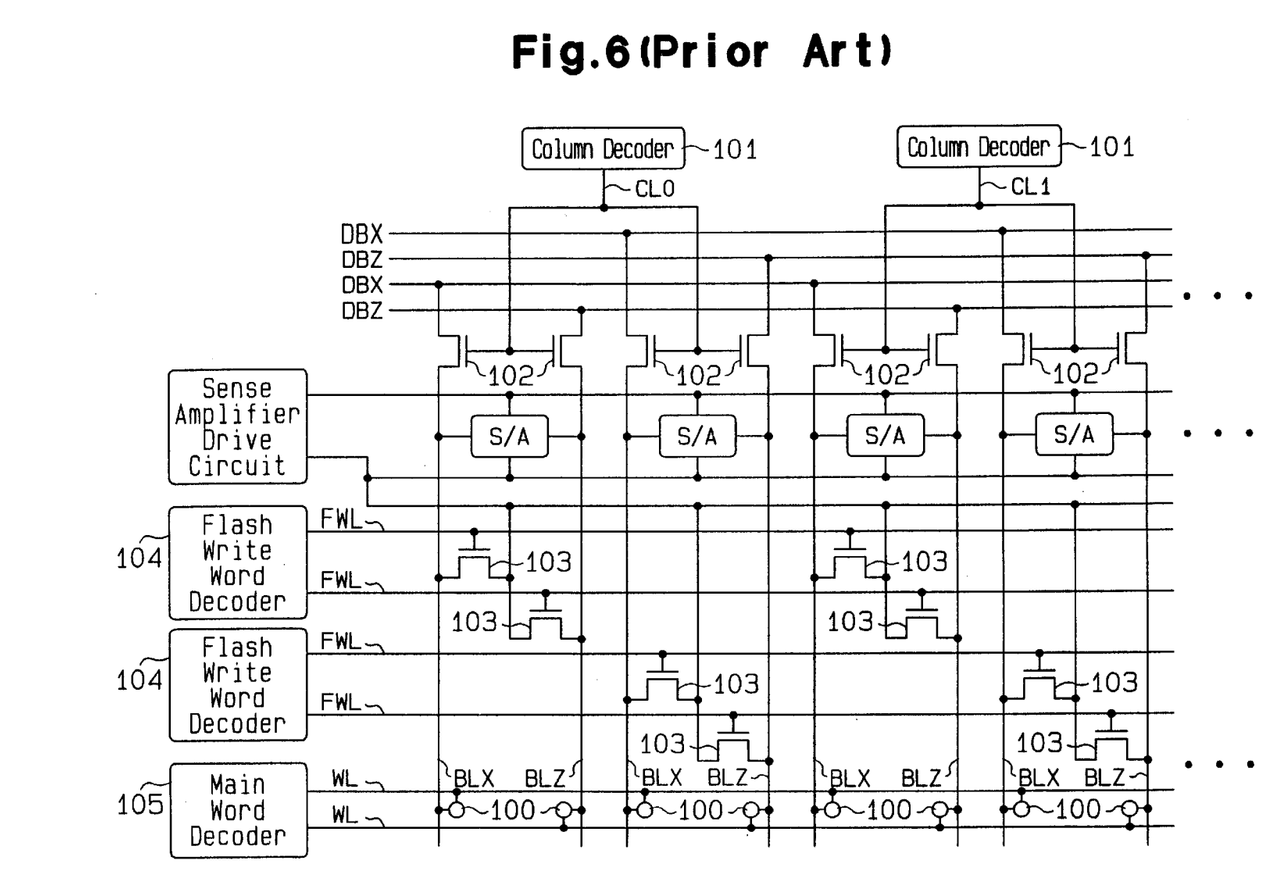
FIG. 6 is a schematic diagram of a cell array structure of a prior art VRAM.

FIG. 6 is a schematic diagram illustrating a cell array structure of a VRAM. During a flash write operation of the VRAM, plural pieces of cell information are rewritten by simultaneously driving flash write transistors 103, which are connected to bit lines BLZ, BLX, with flash write word decoders 104.

However, in addition to word lines WL and a main word decoder 105, the VRAM requires flash write transistors 103, flash write word decoders 104, and word lines FWL, which connect the flash write transistors 103 and the flash write decoders 104. This increases the circuit area of the VRAM. Thus, when the VRAM flash write function is incorporated in the image DRAM, flash write transistors and flash write word decoders increase the circuit area of the image DRAM.

Clock-synchronous type semiconductor memories (called SDRAM) are normally used in recent DRAMs. Since a clock-synchronous type semiconductor memory performs acquisition of external addresses and external commands, input and output of data, and internal circuit operations in synchronism with a system clock, operations at extremely high speeds are enabled. The SDRAM is further provided with a burst operation function. The information of a plurality of memory cells connected to a word line of a designated row address is held by a plurality of sense amplifiers. The sense amplifiers are sequentially selected by column addresses. This reads and writes data at a high speed. However, when memory cells connected to different word lines of the same cell array block are continuously selected, a relatively long time is necessary to read and write data.

In response to the demand for semiconductor memories having a higher speed, a DRAM that performs row access operation in a pipelined manner (hereafter referred to as FCRAM (fast cycle RAM)) has also been proposed. Such type of semiconductor memory reads and writes data at a high speed even if the row addresses are changed during the reading and writing of data. The FCRAM is a synchronous DRAM that has an extremely short operational cycle (e.g., 20 nanoseconds) and synchronously acquires external commands and external addresses in synchronism with a system clock signal. Further, the FCRAM inputs and outputs data in synchronism with the leading edges and trailing edges of the system clock to further increase speed. The synchronous DRAM (especially, FCRAM) is an optimal image DRAM since it operates at high speeds. Accordingly, it would be effective if the FCRAM is provided with the flash write function. However, the incorporation of the above VRAM flash write circuit would enlarge the circuit area. Further, the load applied to the column decoders would increase during flash write operations. Thus, it would be difficult to ensure the writing of flash data just by employing the VRAM flash write circuit.

SUMMARY OF THE INVENTION

It is an object of the present invention to provide a semiconductor memory that enables flash writing without increasing the circuit area.

To achieve the above object, the present invention provides a method for writing data to a semiconductor memory device. The semiconductor memory device includes a plurality of bit lines connected to a common data line by a plurality of column gates, a plurality of column selection lines for controlling the opening and closing of the column gates, a plurality of words lines, and a plurality of memory cells connected to the plurality of bit lines and the plurality of word lines. The method includes the steps of selecting one of the plurality of word lines, and simultaneously activating the plurality of column gates with the plurality of column selection lines. Data of the common data line is written to the plurality of memory cells connected to the selected word line via the plurality of column gates at once. During the step of simultaneously activating the plurality of column gates, the plurality of column selection lines are simultaneously selected at a timing that is earlier than a timing for selecting one of the plurality of column selection lines during a normal write operation.

The present invention also provides a semiconductor memory device including a plurality of column selection lines for controlling the opening and closing of a plurality of column gates, a plurality of bit lines connected to a common data line by the plurality of column gates, a plurality of words lines, a plurality of memory cells connected to the plurality of bit lines and the plurality of word lines, a column decoder connected to the plurality of column selection lines to simultaneously select the plurality of column selection lines during a flash write mode, and a timing pulse generation circuit for providing the column decoder with a timing pulse signal during the flash write mode at a timing that differs from a normal write mode.

The present invention further provides a semiconductor memory device including a plurality of words lines, a word decoder connected to the plurality of word lines, a plurality of bit lines extending perpendicular to the plurality of word lines, a plurality of sense amplifiers respectively connected to the plurality of bit lines, a plurality of column selection lines extending perpendicular to the plurality of bit lines and parallel to the plurality of word lines, a column decoder connected to the plurality of column selection lines, and a plurality of column gates for connecting a common data line to the plurality of bit lines with the associated column selection lines. The plurality of column gates are arranged along the plurality of column selection lines.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

An image DRAM according to a preferred embodiment of the present invention will now be described with reference to the drawings. Although there are non-multiplex FCRAMs and multiplex FCRAMs, the image DRAM of the preferred embodiment is a non-multiplex FCRAM. A non-multiplex FCRAM acquires an external command and an external address (row address and column address) in synchronism with a system clock signal at once. This acquires column addresses more quickly than a conventional SDRAM. Accordingly, by using the column addresses, column gates may be selected more quickly than the conventional SDRAM. Further, by using the column addresses, non-selected memory cell blocks are deactivated to decrease power consumption. In comparison, a multiplex FCRAM acquires row addresses in correspondence with an RAS signal to activate an RAS circuit and acquires column addresses in correspondence with a CAS signal, which follows the RAS signal, to activate a CAS circuit.

Figure 1:
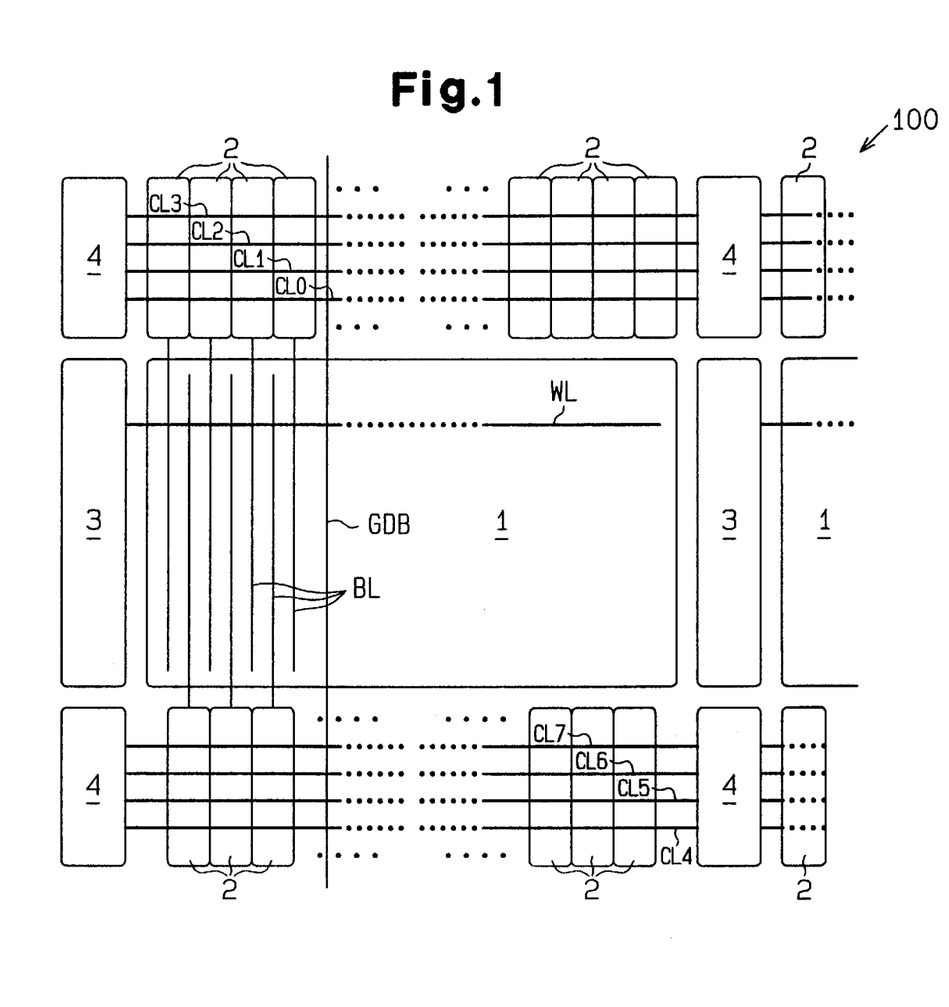
FIG. 1 is a schematic diagram of a cell array structure of an image DRAM.

FIG. 1 is a schematic diagram showing the structure of an image DRAM cell array 100. The cell array 100 includes cell array formation regions 1, sense amplifier formation regions 2, subword decoder formation regions 3, which serve as word decoder formation regions, and subcolumn decoder formation regions 4. The sense amplifier formation regions 2 are arranged above and below the cell array formation regions 1. The subcode decoder formation regions 3 are arranged on the left and right sides of the cell array formation regions 1. Further, the subcolumn decoder formations regions 4 are formed on the left and right sides of the sense amplifier formation regions 2.

Bit lines BL are each formed on the cell array formation regions 1 so as to extend from one sense amplifier region 2 to another sense amplifier region 2. Word lines WL (only one shown) are each formed on the cell array formation regions 1 so as to extend between associated right and left subword decoder formation regions 3.

Global data buses GDB (only one shown) are each formed extending over the cell array formation regions 1 and the sense amplifier formation regions 2 parallel to the bit lines BL. Further, column selection lines CL0–CL7 are each formed extending over the cell array formation regions 1 between the associated left and right subcolumn decoder formation regions 4 parallel to the word lines WL.

In FIG. 1, although only one bit line BL is shown for each sense amplifier, the bit line is formed by a pair of bit lines BLX, BLZ though which complementary signals run. In the same manner, the data bus SDB is formed by a pair of data bus lines GDBX, GDBZ through which complementary signals run.

Figure 2:
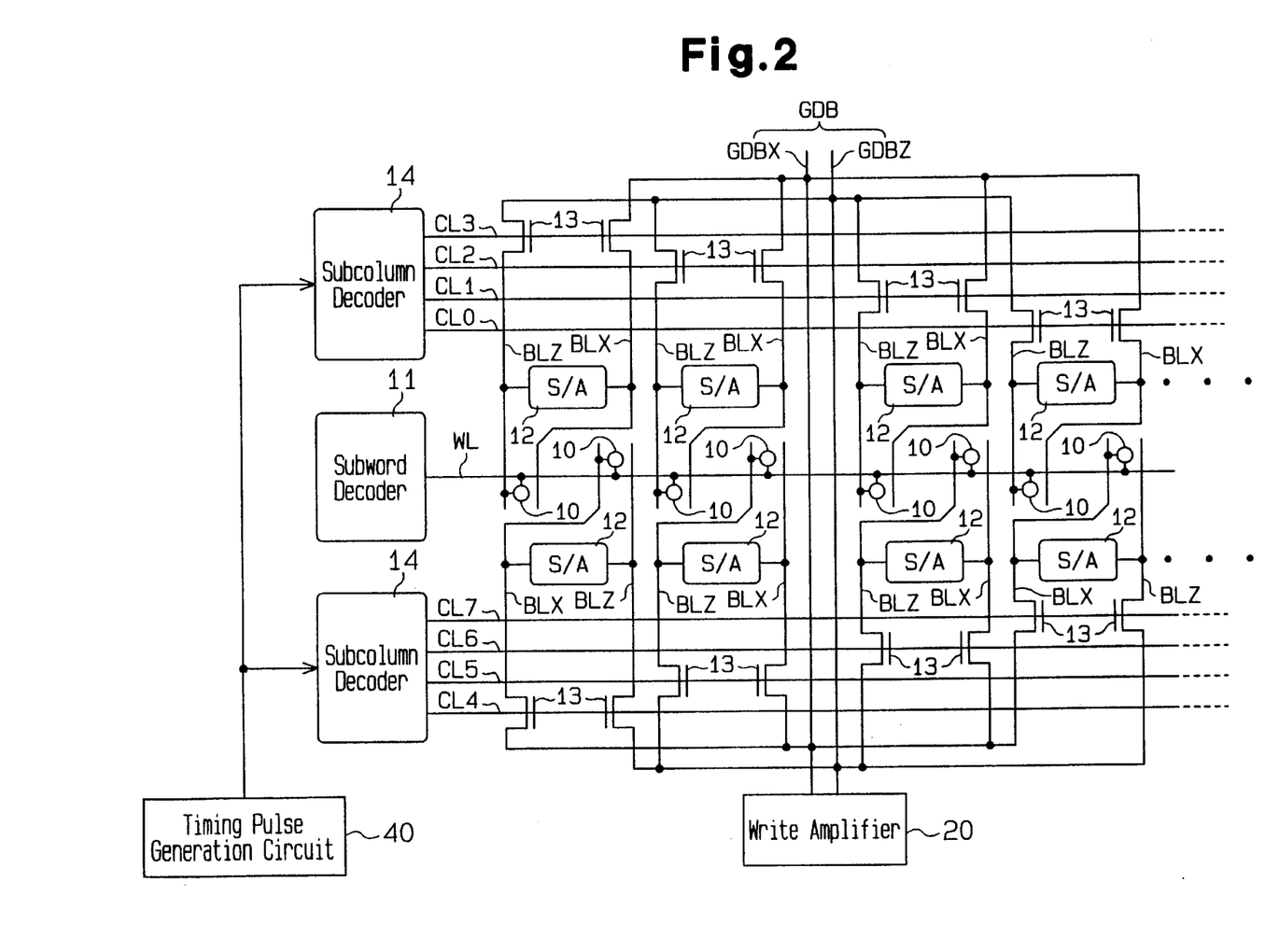
FIG. 2 is a schematic block circuit diagram of the cell array of the image DRAM of FIG. 1.

FIG. 2 is a block diagram of the cell array of FIG. 1. A memory cell 10 is connected to the intersection between each of the bit lines BLX, BLZ and the word lines WL (only one shown). One end of each word line WL is connected to a subword decoder 11, which is formed on the subword decoder region 3.

A sense amplifier 12 connected to an associated pair of the bit lines BLX, BLZ is formed on each sense amplifier region 2. Further, column gate transistors (hereafter simply referred to as column gates) 13 are formed adjacent to the sense amplifiers 12 in the sense amplifier formation region 2. Each set of the column gates 13 are connected to the associated pair of the bit lines BLX, BLZ.

The column selection lines CL0–CL7, each of which is connected to the gate terminals of an associated pair of the column gates 13, are formed parallel to the word lines WL on the sense amplifier formation regions 2. One end of each of the column selection lines CL0–CL7 is connected to a subcolumn decoder 14, which is formed on the subcolumn decoder formation region 4 and serves as a column decoder.

In the preferred embodiment, each of the column selection lines CL0–CL7 is formed parallel to the word line WL and perpendicular to the pairs of the bit lines BLX, BLZ on the formation regions of each column gate 13. Accordingly, the area in which the column selection lines CL0–CL7 are formed is significantly smaller compared to the prior art examples in which the column selection lines are formed outside column gate formation regions parallel to the bit line pairs and perpendicular to the word lines.

Further, the column selection lines CL0–CL7 are formed perpendicular to the bit line pairs BLX, BLZ. Thus, each of the column selection lines CL0–CL7 is easily connected to the associated column gate 13. Additionally, the wiring layout of the column selection lines CL0–CL7 is easily performed when connecting the column selection lines CL0–CL7 to the column gates 13.

The pairs of data bus lines GDBX, GDBZ are formed on the cell array formation regions 1 and the sense amplifier formation regions 2 at fixed intervals. Each pair of the data bus lines GDBX, GDBZ is connected to four of the bit line pairs BLX, BLZ (i.e., four sense amplifiers 12) via the column gates 13. Thus, the interval (layout pitch) between a first pair of the data bus lines GDBX, GDBZ and a second pair of the data bus lines GDBX, GDBZ is determined by four sense amplifiers 12.

During a read operation, the subword decoder 11 selects a word line WL, and the primal pieces of information held by the memory cells connected to the selected word line are provided via corresponding pairs of the bit lines to the associated sense amplifiers and amplified. Then, the subcolumn decoder 14 selects a column selection line, and the information held by the associated sense amplifier is sent via the selected column gate 13 to the data bus GDB.

During a write operation, the subword decoder 11 selects a word line WL, and the subcolumn decoder 14 selects a column selection line. Cell information provided from the pair of data bus lines GDBX, GDBZ and amplified by the sense amplifier 12 is written to the memory cell 10 connected to the selected word line WL and the selected column selection line.

During a flash write operation, the subword decoder 11 selects a word line WL, and the subcolumn decoder 14 selects all of the column selection lines CL0–CL7. Accordingly, all of the memory cells 10 connected to the selected word line WL are selected. Cell information provided from the pair of data bus lines GDBX, GDBZ and amplified by the sense amplifier 12 is written to each one of the selected memory cells 10.

Figure 3:
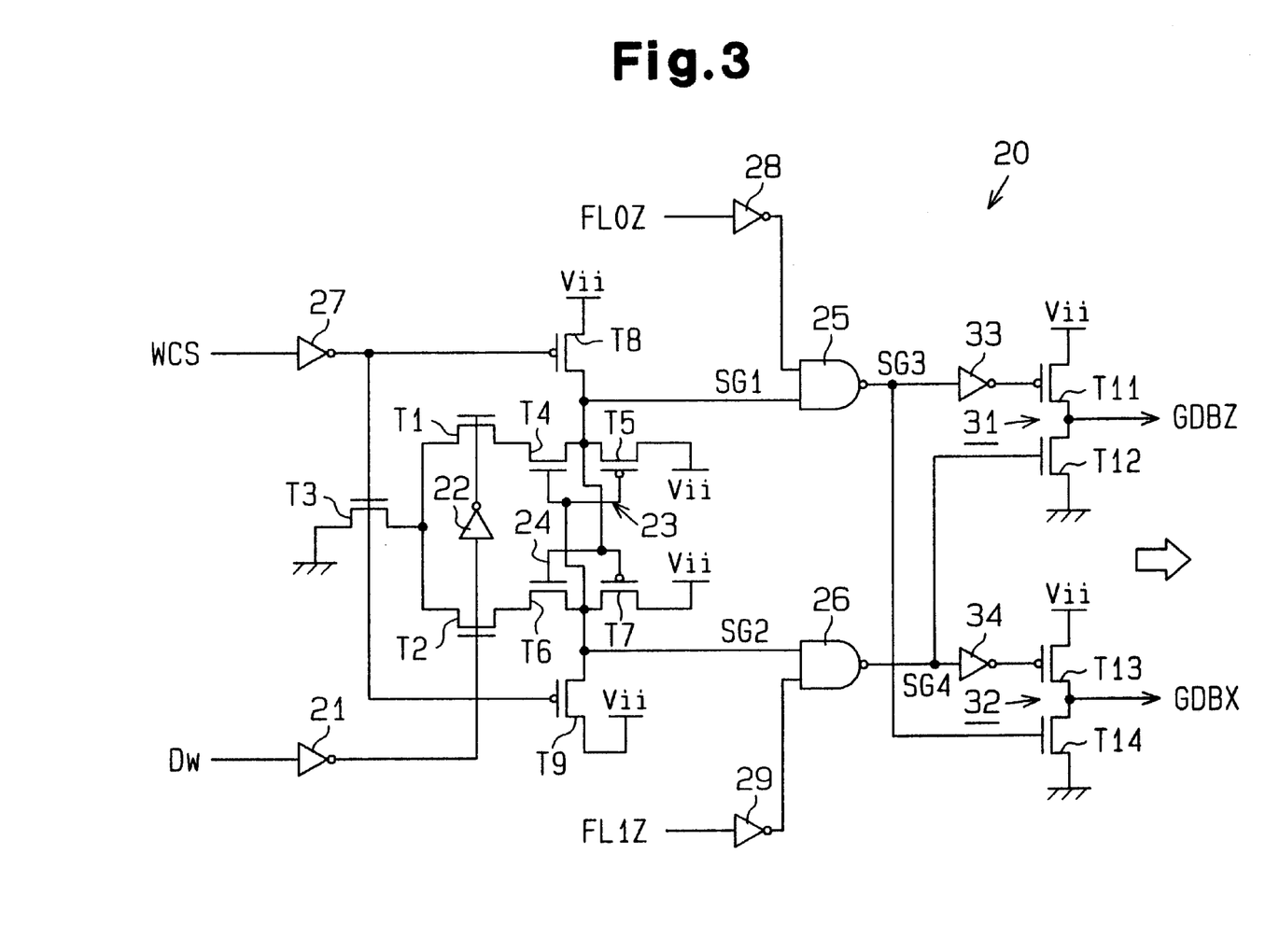
FIG. 3 is a circuit diagram of a write amplifier connected to the cell array of FIG. 2.

FIG. 3 is a circuit diagram of a write amplifier 20. The write amplifier 20 amplifies the cell information written to the memory cells 10 and provides the pair of data bus lines GDBX, GDBZ with the amplified cell information. The write amplifier 20 is a differential amplification circuit having an amplification section, which includes first and second amplification transistors T1, T2. Each of the first and second amplification transistors T1, T2 is preferably an n-channel MOS transistor (NMOS transistor). A write data signal Dw is applied to the gate of the first amplification transistor T1 via inverters 21, 22. The write data signal Dw is the cell information provided from the common data bus (not shown) during the write operation. The write data signal Dw is applied to the gate of the second amplification transistor T2 via the inverter 21. The sources of the first and second amplification transistors T1, T2 are connected to each other, and the nodes of the first and second amplification transistors T1, T2 are grounded via a current control transistor T3, which is an n-channel MOS transistor.

The drain of the first amplification transistor T1 is connected to the source of an NMOS transistor T4 of a first CMOS inverter circuit 23. The source of a p-channel MOS transistor (PMOS transistor) T5 of the first CMOS inverter circuit 23 is connected to the power supply line of a plus power supply voltage Vii.

The drain of the second amplification transistor T2 is connected to the source of an NMOS transistor T6 of a second CMOS inverter circuit 24. The source of a PMOS transistor T7 of the second PMOS inverter circuit 24 is connected to the power supply line of a plus power supply voltage Vii.

The first and second CMOS inverter circuits 23, 24 form a latch circuit. That is, the output terminal of the first CMOS inverter circuit 23 is connected to the input terminal of the second CMOS inverter circuit 24, and the input terminal of the first CMOS inverter circuit 23 is connected to the output terminal of the second CMOS inverter circuit 24. An output signal SG1 of the output terminal of the first inverter circuit 23 is provided to a NAND circuit 25, and an output signal SG2 of the output terminal of the second CMOS inverted circuit 24 is provided to a NAND circuit 26.

The output terminal of the first CMOS inverter circuit 23 is connected to a power supply line of the plus power supply voltage Vii via a PMOS transistor T8, and the output terminal of the second CMOS inverter circuit 24 is connected to the power supply line of the plus power supply voltage Vii via a PMOS transistor T9. A write amplifier control signal WCS is applied via an inverter 27 to the gates of the PMOS transistors T8, T9 and the current control transistor T3. The write amplifier control signal WCS is low during the write operation and high during the flash write operation. The write amplifier control signal WCS is generated based on an external command provided to the DRAM from a DRAM controller, which serves as an external device. When the external command is a normal write command, the write amplifier control signal WCS generated by an internal circuit (not shown) of the FCRAM goes low. When the external command is a read command or a flash write command, the internal circuit of the FCRAM causes the write amplifier control signal WCS to go high.

When the write amplifier control signal WCS is low (during a normal write operation), the PMOS transistors T8, T9 are deactivated and the current control transistor T3 is activated to drive the amplification section. For example, if the write data signal Dw output by a common data bus goes low, the potential at the output terminal of the second CMOS inverter circuit 23 goes low and the first CMOS inverter circuit 23 holds a high output. As a result, the first CMOS inverter circuit 23 causes the output signal SG1 provided to the NAND circuit 25 to go high, and the second CMOS inverter circuit 24 causes the output signal SG2 provided to the NAND circuit 26 to go low. When the write data signal Dw is high, the first CMOS inverter circuit 23 causes the output signal SG1 provided to the NAND circuit 25 to go low, and the second CMOS inverter circuit 24 causes the output signal SG2 provided to the NAND circuit 26 to go high.

When the write amplifier control signal WCS is high (during a flash write operation), the PMOS transistors T8, T9 are activated and the current control transistor T3 is deactivated to deactivate the amplification section. By activating the PMOS transistors T8, T9, the output signals SG1, SG2 of the first and second CMOS inverter circuits 23, 24 go high. As a result, the output signals SG1, SG2 provided to the NAND circuits 25, 26 go high.

The NAND circuit 25 has a first input terminal, which receives the output signal SG1, and a second input terminal, which receives a flash write data signal FL0Z as the cell information via an inverter 28. The NAND circuit 26 has a first input terminal, which receives the output signal SG2, and a second input terminal, which receives a flash write data signal FL1Z as the cell information via an inverter 29.

During operations other than the flash write operation, the flash write data signals FL0Z, FL1Z are both low. During the flash write operation, the flash write data signal FL0Z goes low and the flash write data signal FL1Z goes high when the cell information written to each memory cell 10 is high. When writing cell information having a low level to the memory cells 10 during the flash write operation, the flash write data signal FL0Z goes high and the flash write data signal FL1Z goes low.

In the preferred embodiment, the flash write data signals FL0Z, FL1Z are written to the write amplifier 20 during the flash write operation at a timing that is earlier than when the write data signals Dw are provided to the write amplifier 20 during the normal write operation. More specifically, the non-multiplex FCRAM of the preferred embodiment synchronously acquires an external command and an external address in synchronism with a system clock signal. The flash write data signals FL0Z, FL1Z are provided to specific address input pins and not to data input pins. The two flash write data signals FL0Z, FL1Z are generated based on the flash write data signals received by the address input pins and then provided to the write amplifier 20. The write data signal Dw is provided to an internal circuit of the FCRAM via the data input pins. As described above, the write data signal is acquired by the FCRAM in response to the rising edges and trailing edges of the system clock. However, the internal circuit of the FCRAM converts the serial write data to parallel data. During the serial-parallel conversion, a predetermined time is required for write data to be transmitted from the data input terminal to the write amplifier. Accordingly, the flash write data signals FL0Z, FL1Z are provided to the write amplifier 20 through a bypass route that differs from the route of a normal write data signal. Thus, the flash write data signals SL0Z, FL1Z are provided to the write amplifier 20 before the write data signal Dw.

When the non-multiplex FCRAM of this embodiment is replaced by a multiplex FCRAM, the flash write data signals FL0Z, FL1Z are provided to the write amplifier 20 in correspondence with the RAS circuit activation timing, which is based on the RAS signal. The write data signal Dw is provided to the write amplifier 20 in correspondence with the CAS circuit activation timing, which is based on the CAS signal.

During the normal write operation, the flash write data signals FL0Z, FL1Z are both low. Thus, the NAND circuits 25, 26 output the output signals SG1, SG2 (i.e., the write data signal Dw) of the first and second CMOS inverter circuits 23, 24 as the output signals SG3, SG4.

During the flash write operation, the output signals SG1, SG2 of the first and second CMOS inverter circuits 23, 24 are both high. Thus, the NAND circuits 25, 26 output the flash write data signals FL0Z, FL1Z as the output signals SG3, SG4, respectively.

During operations other than the normal write operation and the flash write operation, the output signals SG1, SG2 are both high and the flash write data signals FL0Z, FL1Z are both low. Thus, the NAND circuits 25, 26 output the output signals SG3, SG4 at low levels, respectively The write amplifier 20 includes a first output section 31, which is configured by a PMOS transistor T11 and an NMOS transistor T12, and a second output section 32, which is configured by a PMOS transistor T13 and an NMOS transistor T14. The drains of the PMOS transistor T11 and the NMOS transistor T12 are connected to each other. The node of the drains defines an output terminal of the write amplifier 20 connected to the data bus line GDBZ. The source of the PMOS transistor T11 is connected to the power supply line of the plus power supply voltage Vii, and the gate of the PMOS transistor T11 is connected to the output terminal of the NAND circuit 26. The source of the NMOS transistor T12 is grounded, and the gate of the NMOS transistor T12 is connected to the output terminal of the NAND circuit 26.

The drains of the PMOS transistor T13 and the NMOS transistor T14 are connected to each other. The node of the drains defines an output terminal connected to the data bus line GDBZ. The source of the PMOS transistor T13 is connected to the power supply line of the plus power supply voltage Vii, and the gate of the PMOS transistor T13 is connected to the output terminal of the NAND circuit 26 via an inverter 34. The source of the NMOS transistor T14 is grounded, and the gate of the NMOS transistor T14 is connected to the output terminal of the NAND circuit 25.

Accordingly, when the output signal SG3 of the NAND circuit 25 is high, and the output signal SG4 of the NAND circuit 26 is low, the first output section 31 provides a high output signal to the data bus line GDBZ, and the second output section 32 provides a low output signal to the data bus line GDBX. Further, when the output signal SG3 is low and the output signal SG4 is high, the first output section 31 provides a low output signal to the data bus line GDBZ, and the second output section 32 provides a high output signal to the data bus line GDBX. Further, when the output signals SG3, SG4 are both high, the output terminals of the first output section 31 and the second output section 32 are both set in a high impedance state.

Accordingly, during the normal write operation, the write data signal Dw of a common data bus is amplified and provided to the data bus lines GDBZ, GDBX. During the flash write operation, the flash write data signals FL0Z, FL1Z are provided to the data bus lines GDBZ, GDBX. In this state, the flash write data signals FL0Z, FL1Z are provided to the data bus lines GDBZ, GDBX before the write data signal Dw.

The write data signal Dw and the flash write data signals FL0Z, FL1Z are provided to the column gates 13 via the data bus lines GDBZ, GDBX. The column gates 13 go on in response to a column selection signal provided from the subcolumn decoder 14 via the column selection lines CL0–CL7. This provides the bit lines BLZ, BLX with the data signal Dw or the flash write data signals FL0Z, FL1Z.

Figure 4:
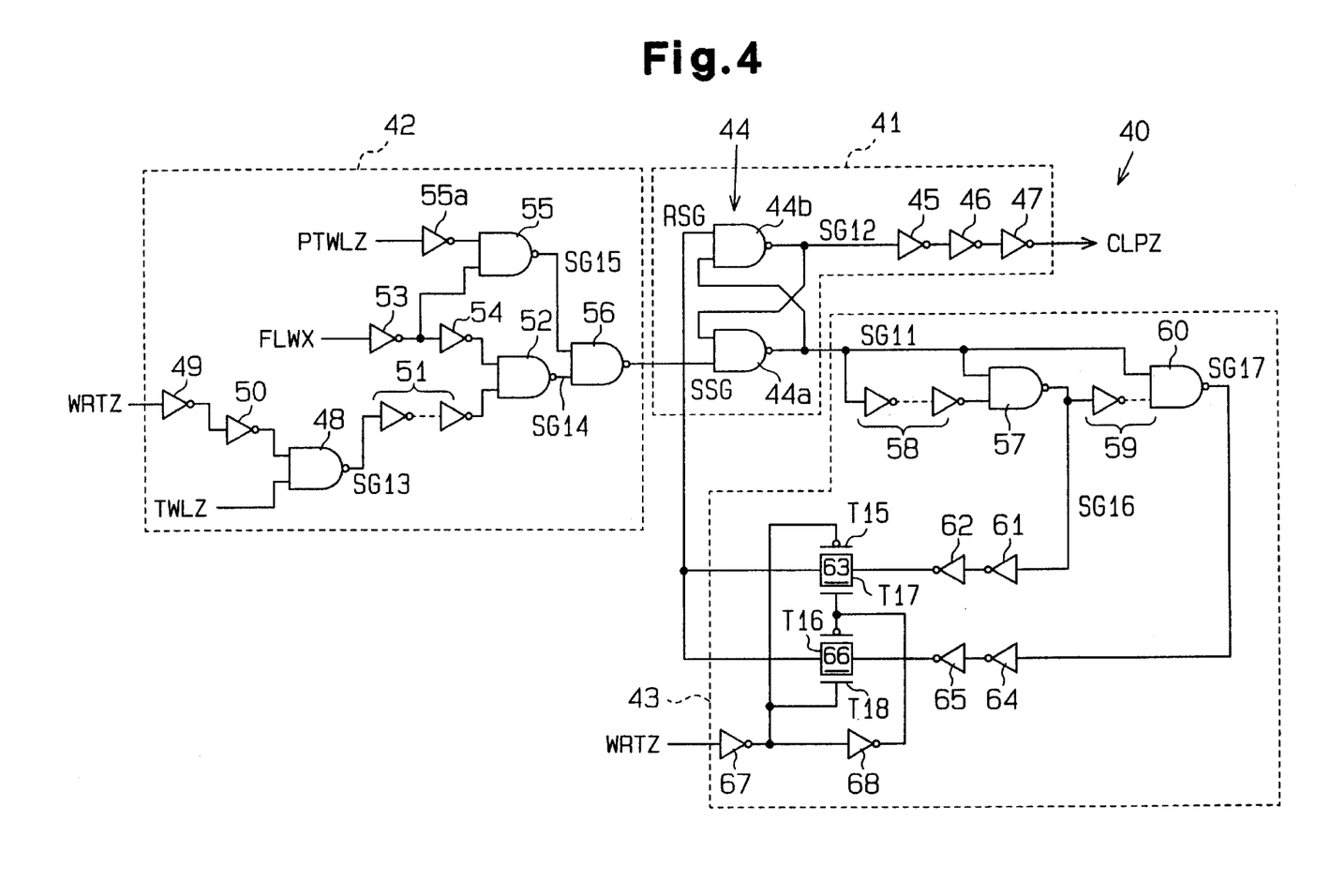
FIG. 4 is a circuit diagram of a timing pulse generation circuit that provides a timing pulse signal to the cell array of FIG. 2.

FIG. 4 is a circuit diagram of a timing pulse generation circuit 40. The timing pulse generation circuit 40 provides the subcolumn decoder 14 with a timing pulse signal CLPZ, which determines the timing for providing the column selection signal to the selected column selection line of the subcolumn decoder 14.

The timing pulse generation circuit 40 has a pulse signal generation section 41, a set signal generation section 42, and a reset signal generation section 43. The pulse signal generation section 41 includes a flip-flop (FF) circuit 44, which is configured by two NAND circuits 44a, 44b. The NAND circuit 44a generates an output signal SG11 at a high level when a set signal SSG from the set signal generation section 42 goes low. In response to the high output signal SG11, the NAND circuit 44b generates an output signal SG12 at a low level. This causes the FF circuit 44 to enter a set state.

In the set state, when the reset signal generation section 43 causes a reset signal RSG, which is provided to the NAND circuit 44b, to go low, the output signal SG12 of the NAND circuit 44b is inverted to a high level, and the output signal SG11 of the NAND circuit 44a is inverted to a low level. This causes the FF circuit 44 to enter a reset state.

The output signal SG12 of the NAND circuit 44b is output as the timing pulse signal CLPZ from the timing pulse generation circuit via inverters 45, 46, 47. Accordingly, the pulse signal generation section 41 outputs the timing pulse signal CLPZ at a high level when the set signal SSG goes low and outputs the timing pulse signal CLPZ at a low level when the reset signal RSG goes low. While the timing pulse signal CLPZ is maintained at a high level, the subcolumn decoder 14 sends the column selection signal to the selected column selection line in response to the timing pulse signal CLPZ. In other words, when the timing pulse signal CLPZ is high, the selected column gates 13 are activated.

[Set Signal Generation Section 42]

A NAND circuit 48 of the set signal generation section 42 receives a write mode signal WRTZ via inverters 49, 50 and a word line timing signal TWLZ. The write mode signal WRTZ is generated by an internal circuit (not shown) of the FCRAM based on an external command. The write mode signal WRTZ is set at a high level during the normal write operation. The word line timing signal TWLZ is a signal for determining the activation timing of the timing pulse signal CLPZ during the write operation and is generated based on an internal activation timing signal (internal RAS), which is generated by the internal circuit of the FCRAM in response to an external active command. The word line timing signal TWLZ is generated by delaying the timing pulse signal, which is used to activate the sense amplifier 12 during the normal write operation, in the internal circuit of the FCRAM. In a multiplex semiconductor integrated device, the timing for providing the word line timing signal TWLZ is substantially the same as the timing for activating the CAS circuit in accordance with the CAS signal.

During operations other than the normal write operation, the NAND circuit 48 generates the output signal SG13 at a high level when the low write mode signal WRTZ goes low. In other words, the word line timing signal TWLZ does not pas through the NAND circuit 48. During the normal write operation, the NAND circuit 48 inverts the high word line timing signal TWLZ and generates the output signal SG13 at a low level.

A NAND circuit 52 receives the output signal SG13 from the NAND circuit 48 via a delay circuit 51 configured by an even number of inverters and receives the flash write mode signal FLWX via inverters 53, 54. The flash write mode signal FLWX is generated by the internal circuit of the FCRAM based on an external command (external flash write command). The flash write mode signal FLWX is set at a low level during the flash write operation and is set at a high level at other times.

Accordingly, during the normal operation, the NAND circuit 52 generates the output signal SG14 based on the output signal SG13 from the NAND circuit 48. That is, the NAND circuit 52 generates the output signal SG14 at a high level when the output signal SG13 is low and generates the output signal SG14 at a low level when the output signal SG13 is high. During the flash write operation, the NAND circuit 52 constantly generates the output signal SG14 at a high level, and the output signal SG13 of the NAND circuit 48 does not pass through the NAND circuit 52.

The NAND circuit 55 receives the flash write mode signal FLWX via the inverter 53 and a preword line timing signal PTWLZ via an inverter 55a. In the same manner as the word line timing signal TWLZ, the preword line timing signal PTWLZ is generated based on an internal activation timing signal (internal RAS) generated by the internal circuit of the FCRAM in response to an external activation command. However, the delay amount of the preword line timing signal PTWLZ relative to the internal RAS is less than the delay amount of the word line timing signal TWLZ relative to the internal RAS. Accordingly, the high preword line timing signal PTWLZ is provided to the set signal generation section 42 from the internal circuit before the word line timing signal TWLZ. In a multiplex semiconductor integrated device, the timing for providing the preword line timing signal PTWLZ is substantially the same as the timing for activating the RAS circuit in accordance with the RAS signal.

The preword line timing signal PTWLZ was originally used to determine the timing for activating the column selection line during the read operation. The timing at which read data from the memory cells reaches the column gates during the read operation is earlier than the timing at which write data input from an external device reaches the column gates via the write amplifier during the write operation. That is, the timing for activating the column selection signal differs between the read operation and the write operation. Accordingly, two types of timing signals, which are the preword line timing signal PTWLZ and the word line timing signal TWLZ, are used as the timing signal for determining the activation initiation timing of the timing pulse signal CLPZ. The present invention uses the preword line timing signal PTWLZ, which has a quicker activation initiation timing, as a reference signal for the activation initiation timing of the column selection signal during the flash write operation.

During the flash write operation, the NAND circuit 55 generates an output signal SG15 based on the preword line timing signal PTWLZ. That is, the NAND circuit 55 generates the output signal SG15 at a high level when the preword line timing signal PTWLZ is low and generates the output signal SG15 at a low level when the preword line timing signal PTWLZ is high. During operations other than the flash write operation, the NAND circuit 55 constantly generates the output signal SG15 at a high level.

A NAND circuit 56 receives the output signals SG14, SG15 of the NAND circuits 52, 55 and provides the set signal SSG to an input terminal of the NAND circuit 44a in the FF circuit 44.

During the normal write operation, when the word line timing signal TWLZ goes high, the set signal SSG goes low after a predetermined delay time, which is set by the delay circuit 51. During the flash write operation, when the preword line timing signal PTWLZ goes high, the set signal SSG goes low.

The word line timing signal TWLZ is delayed by the delay circuit 51. Accordingly, the set signal SSG in the flash write operation goes low before the set signal SSG in the normal write operation. Thus, during the flash write operation, the FF circuit 44 enters the set state earlier than in the normal write operation, and the timing pulse signal CLPZ goes high earlier than in the normal write operation.

[Reset Signal Generation Section]

A NAND circuit 57 receives the output signal SG11 directly from the NAND circuit 44a and via a delay circuit 58, which is configured by an even number of inverters and capacitances (not shown) connected between the inverters. Accordingly, when the output signal SG11 goes high, the NAND circuit 57 generates an output signal SG16 at a high level after a predetermined delay time, which is determined by the delay circuit 58.

A NAND circuit 60 receives the output signal SG11 directly from the NAND circuit 44a and the output signal SG16 via a delay circuit 59, which is configured by an even number of inverters and capacitances (not shown) connected between the inverters. Accordingly, when the output signal SG11 goes high, a NAND circuit 60 generates an output signal SG17 at a high level after a predetermined delay time, which is determined by the delay circuits 58, 59. In other words, when the output signal SG11 of the NAND circuit 44a goes high, the output signal SG16 of the NAND circuit 57 goes high before the output signal SG17 of the NAND circuit 60.

The output signal SG16 of the NAND circuit 57 is provided to a first transfer gate circuit 63 via inverters 61, 62. The output signal SG17 of the NAND circuit 60 is provided to a second transfer gate circuit 66 via inverters 64, 65.

The first transfer gate circuit 63 is configured by a PMOS transistor T15 and an NMOS transistor T17, and the second transfer gate circuit 66 is configured by a PMOS transistor T16 and an NMOS transistor T18. The gates of the PMOS transistor T16 and the NMOS transistor T17 are provided with the write mode signal WRTZ via inverters 67, 68. The gates of the PMOS transistor T15 and the NMOS transistor T18 are provided with the write mode signal WRTZ via an inverter 67.

During the normal write operation, when the write mode signal WRTZ goes high, the first transfer gate circuit 63 goes on, and the high output signal SG16 of the NAND circuit 57 is provided to the NAND circuit 44b as the reset signal RSG. During the flash write operation, when the write mode signal WRTZ goes low, the second transfer gate circuit 66 goes on, and the high output signal SG17 of the NAND circuit 60 is provided to the NAND circuit 44b as the reset signal RSG. In this manner, the FF circuit 44 enters a reset state in response to the high reset signal RSG and the timing pulse signal CLPZ goes low. Accordingly, the timing pulse signal CLPZ in the normal write operation goes low before the timing pulse signal CLPZ in the flash write operation.

Figure 5:
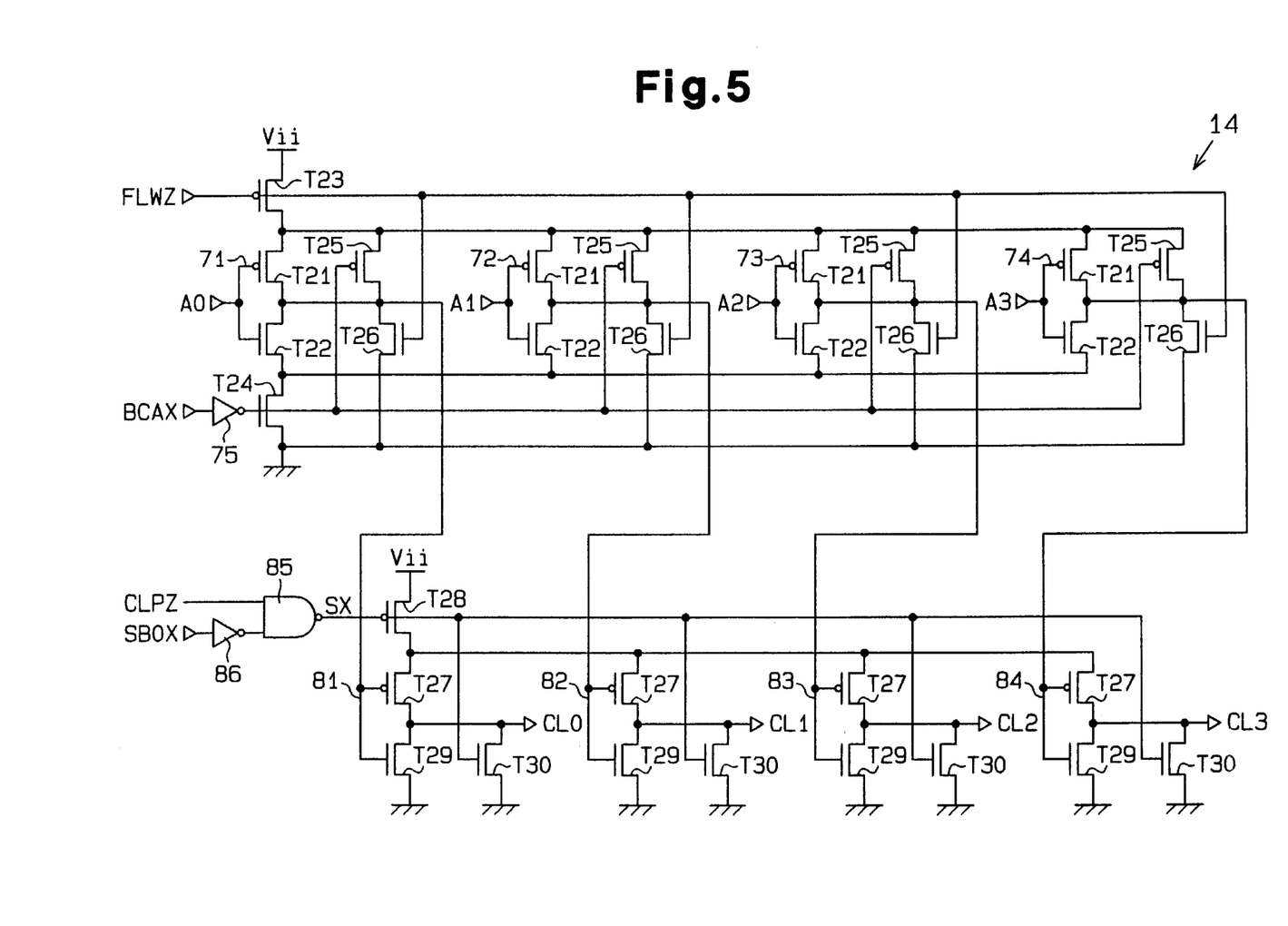
FIG. 5 is a circuit diagram of a subcolumn decoder of the cell array of FIG. 2.

FIG. 5 is a circuit diagram of the subcolumn decoder 14, which selects the columns selection lines CL0–CL3. The structure of the subcolumn decoder 14 is substantially the same as that of the subcolumn decoder 14 that selects the column selection lines CL4–CL7.

The subcolumn decoder 14 has first to fourth address input sections 71–74, each of which is a CMOS inverter circuit, and first to fourth column selection output sections 81–84, each of which is a CMOS inverter circuit. The input terminals of the first to fourth address input sections 71–74 are provided with the column selection address signals A0–A3, respectively. PMOS transistors T21 of the first to fourth address input sections 71–74 are each connected to the power line of the plus power supply voltage Vii via a common PMOS transistor T23. NMOS transistors T22 of the first to fourth address input sections 71–74 are each grounded via a common PMOS transistor T24.

A PMOS transistor T25 is connected to each PMOS transistor T21 of the first to fourth address input sections 71–74. The output terminals of the first to fourth address input sections 71–74 are each grounded via an NMOS transistor T26.

The flash write mode signal FLWX, which is the inverted flash write mode signal FLWZ, is provided to the gates of the common PMOS transistor T23 and the NMOS transistors T26. A first column decoder selection signal BCAX is provided to the gates of the common NMOS transistor T24 and the PMOS transistors T25 via an inverter 75. The first column decoder selection signal BCAX is a signal that selects activation or deactivation of each of the column decoders 14, which correspond to the same memory block. The first column decoder selection signal BCAX goes low to activate the column decoders 14 and goes high to deactivate the column decoders 14.

When the first column decoder selection signal BCAX is low during a mode other than the flash write mode, the first to fourth address input sections 71–74 provide the first to fourth column selection output sections 81–84 with the inverted signals of the column selection address signals A0–A3.

When the first column decoder selection signal BCAX is low during the flash write mode, the PMOS transistor T23 goes off and the NMOS transistors T26 go on. Accordingly, the output signals of the first to fourth address input sections 71–74 all go low.

The input terminals of the first to fourth column selection signal output sections 81–84 are respectively connected to the output terminals of the first to fourth address input sections 71–74, and the output terminals of the first to fourth column selection signal output sections 81–84 are respectively connected to the column selection lines CL0–CL3.

Each PMOS transistor T27 of the first to fourth column selection signal output sections 81–84 are connected to the power supply line of the plus power supply voltage Vii via a common PMOS transistor T28. NMOS transistors T29 of the first to fourth column selection signal output sections 81–84 are each connected parallel to an NMOS transistor T30. The sources of both transistors 29, 30 are grounded.

The gates of the PMOS transistors T28 and each of the NMOS transistors T30 receive a drive signal SX from a NAND circuit 85. The NAND circuit 85 receives a second column decoder selection signal SB0X via an inverter 86 and the timing pulse signal CLPZ from the timing pulse generation circuit 40. The second column decoder selection signal SB0X is a signal that selects activation or deactivation of the column decoder of each of the memory blocks. The second column decoder selection signal SB0X goes low for activation and goes high for deactivation.

When the second column decoder selection signal SB0X goes high, the drive signal SX of the NAND circuit 85 goes high, the PMOS transistor T28 goes off, and the NMOS transistor T30 goes on. As a result, the first to fourth column selection signal output sections 81–84 output a low signal and none of the column selection lines CL0–CL3 are selected.

When the second column decoder selection signal SB0X is low and the timing pulse signal CLPZ is high, the PMOS transistor T28 goes on, each of the NMOS transistors T30 go off, and the first to fourth column selection output sections 81–84 are activated.

During the normal write operation or read operation, the first to fourth selection signal output sections 81–84 output the column selection signal in accordance with the column address signal A0–A3 from the first to fourth address input sections 71–74. That is, the high column selection signal is provided only to the selected column selections lines CL0–CL3.

During the flash write operation, the output signals of all of the first to fourth address input sections 71–74 go low. As a result, the first to fourth column selection signal output sections 81–84 provide the high column selection signal to all of the column selection lines CL0–CL3 in response to the low output signal. Accordingly, during the flash write operation, all of the column gates 13, which are connected to the columns selection lines CL0–CL3 go on.

During the flash write operation, the timing pulse signal CLPZ goes high earlier than during the normal write operation. As a result, all of the column gates 13 connected to each of the column selection lines CL0–CL3 go on earlier than during the write operation. Furthermore, the timing pulse signal CLPZ goes low later than during the normal write operation. As a result, the column gates 13 go off later than during the normal write operation.

The advantages of the image DRAM of the preferred embodiment will now be discussed.

(1) In the preferred embodiment, the column selection lines CL0–CL7 are formed in the sense amplifier formation regions 2 at the formation location of the column gates 13 parallel to the word lines (perpendicular to the bit line pairs BLX, BLZ). Accordingly, the formation area of each of the column selection lines CL0–CL7 are significantly smaller in comparison to the prior art example in which the column selection lines are formed parallel to the bit lines outside the column gate formation region. Further, the column gates 13 are arranged along the associated column selection lines CL0–CL7. This simplifies the connection of the column selection lines CL0–CL7 to the column gates 13. Additionally, the wiring layout of each of the column selection lines is simple and the wiring area is reduced.

(2) In the preferred embodiment, during the flash write operation, the subcolumn decoder 14 selects all of the column selection lines CL0–CL7 and activates all of the column gates 13. This enables the flash writing of data to all of the memory cells 10 connected to the selected word lines WL. Accordingly, flash writing may be performed without using, for example, the flash write transistor 103, the flash write decoder 104, and the flash write word lines FWL of FIG. 6. As a result, the area of the image DRAM need not be increased (3) In the preferred embodiment, during the flash write operation, the write amplifier 20 outputs the flash write data signal before the normal write operation. During the flash write operation, the timing pulse generation circuit 40 provides the timing pulse signal CLPZ to the subcode decoder 14 in correspondence with the output timing of the flash write data signal so that the column gates 13 are activated earlier than during the normal write operation. That is, the flash write operation is performed by outputting the flash write data signal earlier than during the normal write operation and activating the column gates 13 earlier than during the normal write operation. Accordingly, the flash write operation is initiated earlier than the normal write operation. As a result, during the flash write operation, even if the load applied to the subcode decoder 14 increases to activate all of the column gates 13 and delays the operation of the subcode decoder 14, data is written in the same manner as during the normal write operation without causing any problems.

In addition, the problem of the delay of the subcolumn decoder 14 due to an increase in the load applied to the subcolumn decoder 14 is solved. Thus, the driving capability of each transistor of the subcode column decoder 14 does not have to be increased, and the size of the subcolumn decoder 14 does not have to be increased.

(4) In the preferred embodiment, during the flash write operation, the output signals of the first to fourth address input sections 71–74 that are provided to the first to fourth column selection output sections 81–84 all go low when the flash write mode signal FLWZ goes high. This causes the column selection signals of all of the column selection lines CL0–CL3 to go high. In other words, during the flash write operation, the high flash write mode signal FLWZ causes all of the column gates 13 connected to the column selection lines CL0–CL3 to go on. Accordingly, special column selection address signals A0–A3 are not required to flash write data to the first to fourth address input sections 71–74.

(5) In the preferred embodiment, during the flash write operation, the cell information written to the memory cells 10 is easily selected by shifting the values of the flash write data signals FLA0Z, FLA1Z, which are provided to the write amplifier 20. In addition, the flash write data signals FL0Z, FL1Z are directly provided from the address input pins via the reset circuit and the latch circuit before the write data signal Dw. Accordingly, the write amplifier 20 enables timing adjustment of the flash write data signals FL0Z, FL1Z relative to the write data signal Dw without using a special and complicated timing adjustment circuit.

It should be apparent to those skilled in the art that the present invention may be embodied in many other specific forms without departing from the spirit or scope of the invention. Particularly, it should be understood that the present invention may be embodied in the following forms.

(1) The present invention may be applied to a multiplex FCRAM. In this case, the preword line timing signal PTWLZ and the flash write data signals FL0Z, FL1Z are adjusted based on the RAS signal. The column decoder selects all of the column selection lines based on the flash write mode signal FLWZ.

(2) In addition to image DRAMs, the present invention may be applied to semiconductor memory devices that are provided with other flash write functions.

(3) The driving capability of the transistors of the subcolumn decoder 14 may be increased to adapt to large loads. In this case, the timing for initiating flash write operations is substantially the same as during the normal write operation.

The present examples and embodiments are to be considered as illustrative and not restrictive, and the invention is not to be limited to the details given herein, but may be modified within the scope and equivalence of the appended claims.

What is claimed is:

1. A method for writing data to a semiconductor memory device, wherein the semiconductor memory device includes a plurality of bit lines connected to a common data line by a plurality of column gates, a plurality of column selection lines for controlling the opening and closing of the column gates, a plurality of words lines, and a plurality of memory cells connected to the plurality of bit lines and the plurality of word lines, the method comprising the steps of:

selecting one of the plurality of word lines; and
   simultaneously activating the plurality of column gates with the plurality of column selection lines, wherein data of the common data line is written to the plurality of memory cells connected to the selected word line via the plurality of column gates at once, and wherein during the step of simultaneously activating the plurality of column gates, the plurality of column selection lines are simultaneously selected at a timing that is earlier than a timing for selecting one of the plurality of column selection lines in a normal write operation.

2. The method for writing data to a semiconductor memory device according to claim 1, wherein the data is provided from an address terminal.

3. The method for writing data to a semiconductor memory device according to claim 1, wherein the semiconductor memory device is a synchronous semiconductor memory device that acquires a row address and a column address in synchronism with a clock signal at once.

4. A semiconductor memory device comprising:

a plurality of column selection lines for controlling the opening and closing of a plurality of column gates;
   a plurality of bit lines connected to a common data line by the plurality of column gates;
   a plurality of words lines;
   a plurality of memory cells connected to the plurality of bit lines and the plurality of word lines;
   a column decoder connected to the plurality of column selection lines to simultaneously select the plurality of column selection lines in a flash write mode; and a timing pulse generation circuit for providing the column decoder with a timing pulse signal in the flash write mode at a timing that is earlier than that of a normal write mode.

5. The semiconductor memory device according to claim 4, wherein the column decoder simultaneously selects the plurality of column selection lines in response to a mode signal that is based on an external flash write command.

6. The semiconductor memory device according to claim 4, further comprising a write amplifier for providing data to the common data line, wherein the data is provided from an address terminal to the write amplifier in the flash write mode.

7. The semiconductor memory device according to claim 4, wherein the semiconductor memory device is a synchronous semiconductor memory device that acquires a row address and a column address in synchronism with a clock signal at once.

* * * * *